United States Patent [19]
Park et al.

[11] 3,940,847
[45] Mar. 2, 1976

[54] METHOD OF FABRICATING ION IMPLANTED ZNSE P-N JUNCTION DEVICES

[75] Inventors: Yoon Soo Park, Kettering; Bok Kyoon Shin, Dayton, both of Ohio

[73] Assignee: The United States of America as represented by the Secretary of the Air Force, Washington, D.C.

[22] Filed: July 26, 1974

[21] Appl. No.: 492,075

[52] U.S. Cl. .................. 29/590; 148/1.5; 357/91
[51] Int. Cl.² ............................................. B01J 17/00
[58] Field of Search .......... 148/1.5; 357/91, 61, 63; 29/576 B, 590, 576, 589

[56] References Cited
UNITED STATES PATENTS

| | | |
|---|---|---|
| 3,293,084 | 12/1966 | McCaldin .................. 29/576 B X |
| 3,341,754 | 9/1967 | Kellett et al. .................. 148/1.5 X |
| 3,383,567 | 5/1968 | King et al. .................. 357/91 X |
| 3,457,632 | 7/1969 | Dolan, Jr. et al. .................. 29/576 B X |
| 3,459,603 | 8/1969 | Weisberg et al. .................. 148/1.5 |
| 3,549,434 | 12/1970 | Aven .................. 148/1.5 X |
| 3,638,300 | 2/1972 | Foxhall .................. 29/576 B X |
| 3,705,059 | 12/1972 | Kun .................. 357/63 X |
| 3,732,471 | 5/1973 | Hou et al. .................. 148/1.5 X |

*Primary Examiner*—Roy Lake
*Assistant Examiner*—James W. Davie
*Attorney, Agent, or Firm*—Joseph E. Rusz; Robert K. Duncan

[57] ABSTRACT

Light emitting diodes, switching diodes with memory, and backward diodes are fabricated by phosphorus ion implantation of a p-n semiconductor junction in aluminum doped zinc selenide substrate material.

5 Claims, 17 Drawing Figures

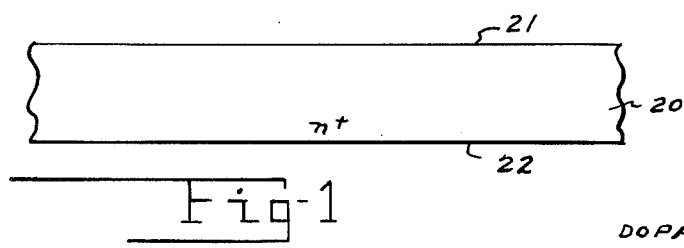
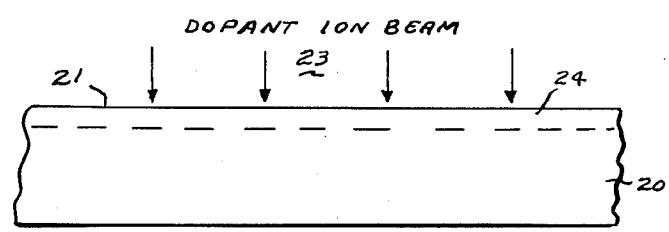
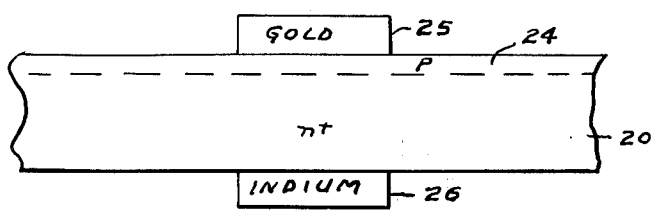
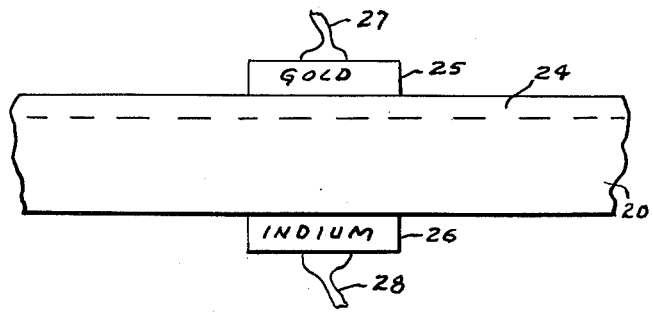
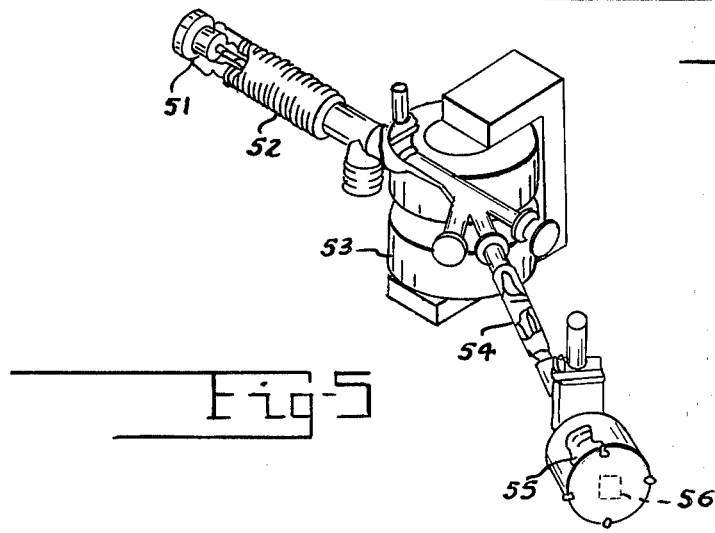

METHOD OF FABRICATING ION IMPLANTED ZNSE P-N JUNCTION DEVICES

RIGHTS OF THE GOVERNMENT

The invention described herein may be manufactured and used by or for the Government of the United States for all governmental purposes without the payment of any royalty.

BACKGROUND OF THE INVENTION

The field of the invention is in the art of ion implanted, p-n junction, solid state devices.

The creation of p-n junction devices by the diffusion process in common semiconductor material is well established. The creation of p-n junction devices in the exotic semiconductor materials such as zinc selenide by diffusion has not been generally successful due to a phenomenon known as vacancy compensation as pointed out by King et al. in U.S. Pat. No. 3,383,567. While King et al. do mention the creation of p-n junctions in ZnSe by phosphorous ion implantation, they appear to be mainly concerned with the creation of junctions in a diamond body substrate. Kellett et al. in U.S. Pat. No. 3,341,754 disclose the process of producing precision resistors in silicon semiconductor material by phosphorus ion implantation. Weisberg et al. in U.S. Pat. No. 3,459,603 disclose the method of fabricating diffusion phosphorus doped ZnSe crystals, to provide electroluminescent devices. Other patents that may be of interest in connection with the background of this invention are: U.S. Pat. Nos. 3,549,434, patentee M. Aven; 3,496,429, patentee R. J. Robinson; and 3,705,059 patentee Z. K. Kun.

The desirability of creating semiconductor devices in widebandgap II–VI compounds, (group II and group VI of Mendelyeev's Periodic Table), has been well recognized due to their excellent potential for electronic and optoelectronic applications such as visible injection electroluminescent devices and integrated optical circuit elements. ZnSe has been a particularly intriguing material because it is a highly efficient phosphor with a direct bandgap of 2.67 eV at room temperature and has the highest covalent bonding of the II–VI compounds. Although low-resistivity n-type ZnSe can be produced easily by conventional methods, the corresponding p-type ZnSe cannot due to self-compensation effects. Recent advances in ion implantation technology have shown it to be an effective means of introducing type converting dopants.

Further information on devices of this invention may be found in the following published articles by the inventors. Page 1444, Journal of Applied Physics, Vol. 45, No. 3, March 1974, entitled "Injection Electroluminescence in Phosphorus-Ion-Implanted ZnSe p-n Junction Diodes", and at page 538, Vol. 62 in the Proceedings of the IEEE for April 1974 entitled, "Switching and Memory Effects in Phosphorus-Ion-Implanted ZnSe Devices."

SUMMARY OF THE INVENTION

P-N junctions are formed in aluminum doped ZnSe by phosphorus ion implantation to provide improved semiconductor devices. In the disclosed processes of fabrication the magnitudes of the dopants, the implant energy, the phosphorus concentration, the annealing temperature, the annealing time, and the conditions of annealing environment, are varied to provide new light emitting diodes, backward diodes, and switching diodes with memory.

BRIEF DESCRIPTION OF THE DRAWING

FIG. 1 shows schematically a ZnSe wafer;

FIG. 2 shows schematically the dopant ion beam producing the p-layer;

FIG. 3 shows schematically the contacts to the p-n junction ZnSe wafer;

FIG. 4 shows schematically the electrical connections to the contacts;

FIG. 5 shows a representative pictorial view of an ion implantation system;

FIG. 11b is an enlargement about the origin of the curve shown in FIG. 11a;

DESCRIPTION OF THE PREFERRED EMBODIMENTS

Figure 10:
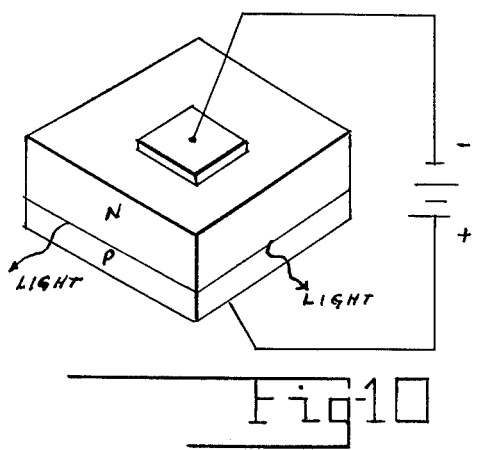
FIG. 10 is a schematic-pictorial view of an electroluminescent (light emitting diode) device.

The semiconductor base material for the embodiments of this invention is conventional melt-grown, single-crystal, cubic n-type ZnSe doped with aluminum in concentrations ranging from approximately 10 ppm to approximately 1000 ppm. The resistivity of such crystals is high, normally in the range of $10^7$ to $10^9$ $\omega$-cm at room temperature due to defects produced during growth. This has been found to be true even though the use of n-type dopants such as aluminum might be expected to produce high n-type conductivity.

The substrates for all embodiments are conventionally heat treated in molten zinc for approximately 24 hours at approximately 900°C. The following table sets forth the general properties of the n-type ZnSe substrate base material after heat treating.

| Al Concentration | Carrier Concentration (cm$^{-3}$) | Resistivity (Ω-cm) |
|---|---|---|
| Undoped | 10$^{16}$ | 1.0 |
| 10 ppm | 10$^{17}$ | .10 |
| 100 ppm | 10$^{18}$ | .01 |
| 1000 ppm | 10$^{19}$ | .001 |

This heat treating provides substrate elements having electron mobilities of the range of approximately 350 cm$^2$/V-sec to 800 cm$^2$/V-sec. As a typical example a substrate having a carrier concentration of 10$^{18}$ cm$^{-3}$, a resistivity of 0.01 ω-cm (an aluminum doped element to a concentration of 100 ppm), had an electron mobility of 374 cm$^2$/V-sec.

Prior to implantation, each substrate embodiment 20, as shown in FIG. 1, is mechanically polished on the surface 21 of the (110) crystal plane on which the p-type layer is to be formed and chemically etched on both this surface and the opposite surface 22, (also a (110) crystal plane). A suitable etching solution is two parts $H_2SO_4$ and three parts aqueous solution of $K_2Cr_2O_7$. Approximately 1 minute of etching at a temperature of 70° to 90°C has been found to be generally preferable. It is not critical. The temperature determines only the rate of the etching. Following the etching of the surfaces, the substrate elements are rinsed in a boiling 25 percent (by weight) solution of NaOH for approximately 20 seconds, then successively rinsed in boiling trichloroethylene, acetone, boiling methanol, and deionized water.

As shown in FIG. 2 the phosphorus dopant ion beam 23 forms a p-type layer 24 in the crystal. The ion implantation process is well known. A typical conventional ion implantation apparatus is shown in FIG. 5. The ions are formed in the ion source 51, accelerated in the accelerator 52, passed through the mass separator 53, and swept by the beam sweeping section 54 which directs them into the multiple heated target chamber 55 in which they implant on the enclosed specimen 56.

Phosphorus is the preferred p-type dopant for these devices since a Group V element acts as an acceptor impurity in the host material by substituting for selenium atoms. Conventional room temperature is a suitable temperature for the implantation. It is preferred over cooler temperatures, because a greater amount of damage to the hose material generally occurs at lower temperatures. Typical implantation energies are from 70 to 400KeV with corresponding dosages ranging from approximately 10$^{16}$ to 10$^{14}$ per square centimeter. The following table lists approximate typical parameters at these magnitudes.

| Energy (KeV) | Dose (cm$^{-2}$) | Sheet Hole Concentration (cm$^{-2}$) | Sheet Resistivity (Ω/square) |
|---|---|---|---|
| 70 | 10$^{16}$ | 10$^{14}$ | 10$^4$ |
| 400 | 10$^{14}$ | 10$^{13}$ | 10$^5$ |

After ion implantation the devices are post-annealed at a temperature from approximately 450° to 600° Centigrade for approximately 5 to 10 minutes. The preferred annealing environment depends upon the specific application of the device, as will be set forth later. Generally the annealing will be a vacuum of approximately 10$^{-6}$ torr or in argon gas at atmospheric pressure (the argon gas environment preferred); or for the switching diode devices conventional room air at room conditions is the preferred annealing environment. Most of the annealing takes place within a short period (5 to 10 minutes). Devices have been annealed over the temperature of 425° to 750°C and for durations up to two hours, however, the shorter times at the previously stated temperatures are generally suitable and preferred for expediency. The post-annealing after implantation removes implantation-induced radiation damage produced on the implanted layer. Hole mobilities of 5 to 10 cm$^2$/V-sec are typical for the annealed elements.

After annealing, an ohmic contact of gold 25 is made to the p-layer 24 (FIG. 3) by conventional sputtering or evaporation. The contact 26 on the other side of the substrate is substantially pure indium, made by conventional ultrasonic soldering using indium solder (Indalloy No. 4). Electrical connections to those contacts may be made either by conventional pressure methods or by the soldering of electrical lead wires 27 and 28 to the contacts. Typical embodiments of semiconductor devices fabricated as taught herein have the physical dimensions of being approximately 0.1 cm square and 0.02 cm thick. The gold contact is approximately a 20 mils in diameter and the Indium contact covers nearly all the backside of the substrate. The contact areas on the crystal are not critical. Conventional practices in making contact with semiconductor elements are satisfactory.

Figure 6:
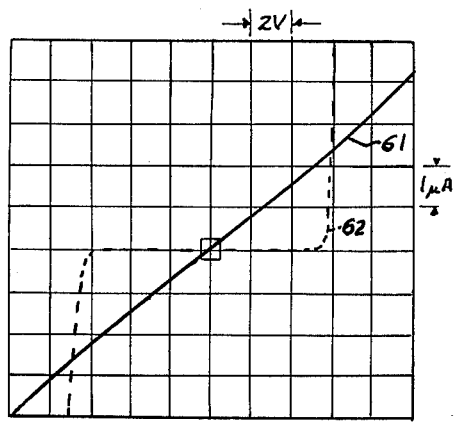
FIG. 6 shows a typical plot of the current-voltage characteristics showing the comparison of gold contacts to a phosphorus implanted postannealed p-type ZnSe layer with that of gold contacts to an n-type ZnSe portion masked from the ion beam.

Curve 61 in FIG. 6 shows the ohmic nature of the Au contacts to an annealed p-type ZnSe layer where the I–V characteristic is linear over a considerable range of the applied bias voltage in both directions. Neither the Au contacts to an n-type ZnSe portion of the substrate that was masked from the ion beam during implantation nor those to an unannealed implanted layer displayed linearity in their I-V curves, as is shown in curve 62. Thus, it is shown that a p-type layer exists (created by the P-ion implantation) in the substrate providing the ohmic contact with the gold. (Gold does not make an ohmic contact with n-type material.)

Sheet-resistance measurements made on the p-type layer of typical embodiments of the invention showed ohmic characteristics over a considerable voltage range. The resistivity of the implanted p-layer was 10 to 570 ω-cm, indicating that a fairly shallow acceptor level had formed due to P-ion implantation in the n-type ZnSe.

Figure 7:
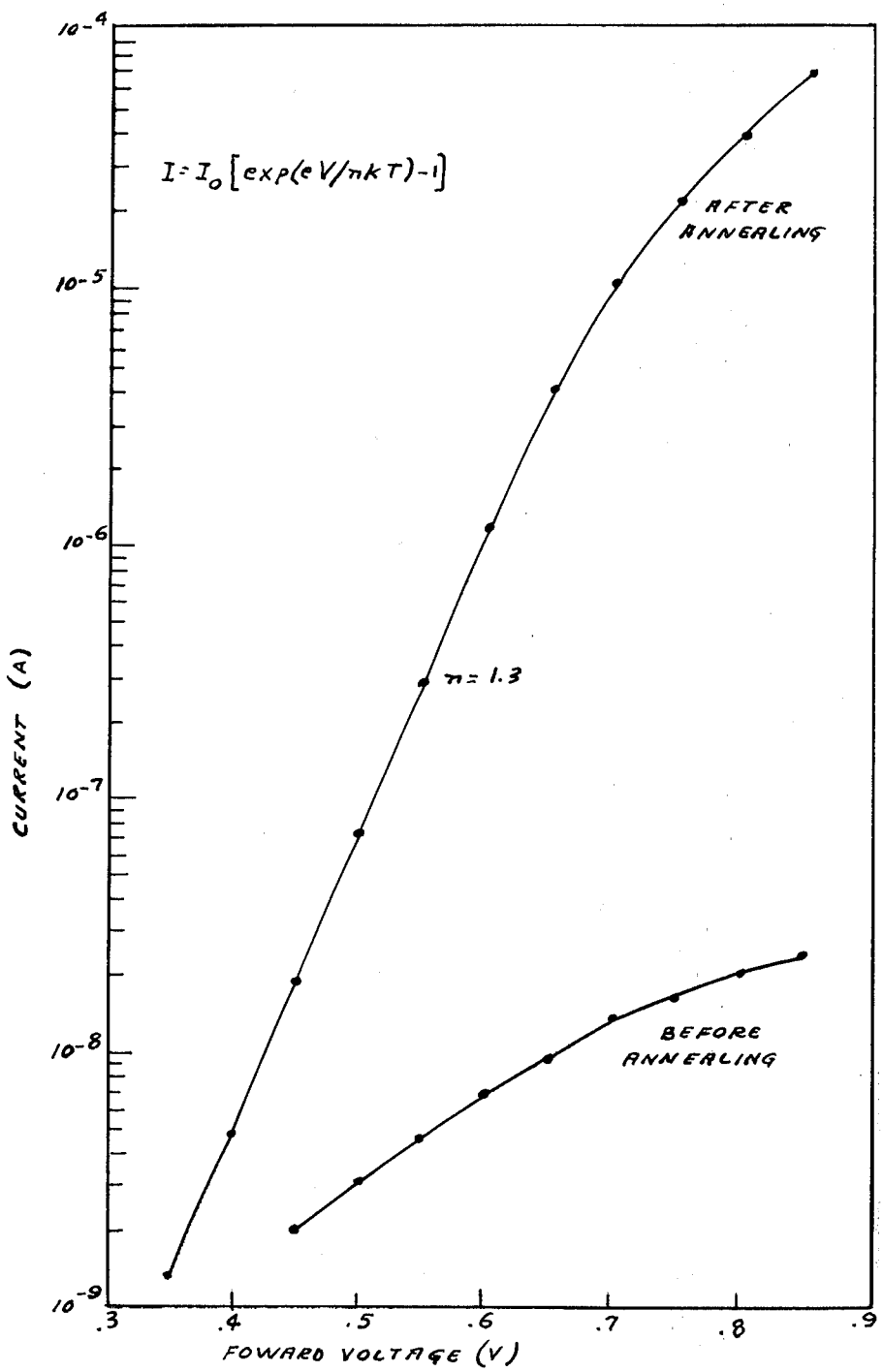
FIG. 7 is a semi-log plot of dc current-voltage characteristics of a phosphorus implanted ZnSe diode at room temperature in the dark as implanted and after annealing at 450°C for 5 minutes.

The I-V characteristic of the diodes of this invention obey an ideal p-n junction relation $I = I_0[exp(eV/nkT)-1]$. A semilog plot of the I-V characteristics of a typical embodiment of the invention, at room temperature, both before and after annealing is shown in FIG. 7. It is to be noted that the coefficient n has the value ≈ 1.3 which remains nearly constant for about four decades of the current range. The electrical breakdown for this embodiment occurs at ≈ 30V in room temperature.

Typical C-V (capacitance-voltage) characteristics of embodiments measured at room temperature in the dark, have the approximate form $C \propto V^{-1/3}$, indicating probable formation of linearly graded junctions. At zero bias typical junction capacitance value is ≈ 1.7×10$^{-8}$ F/cm$^2$. The corresponding depletion width is ≃ 0.46 microns.

Figure 8:
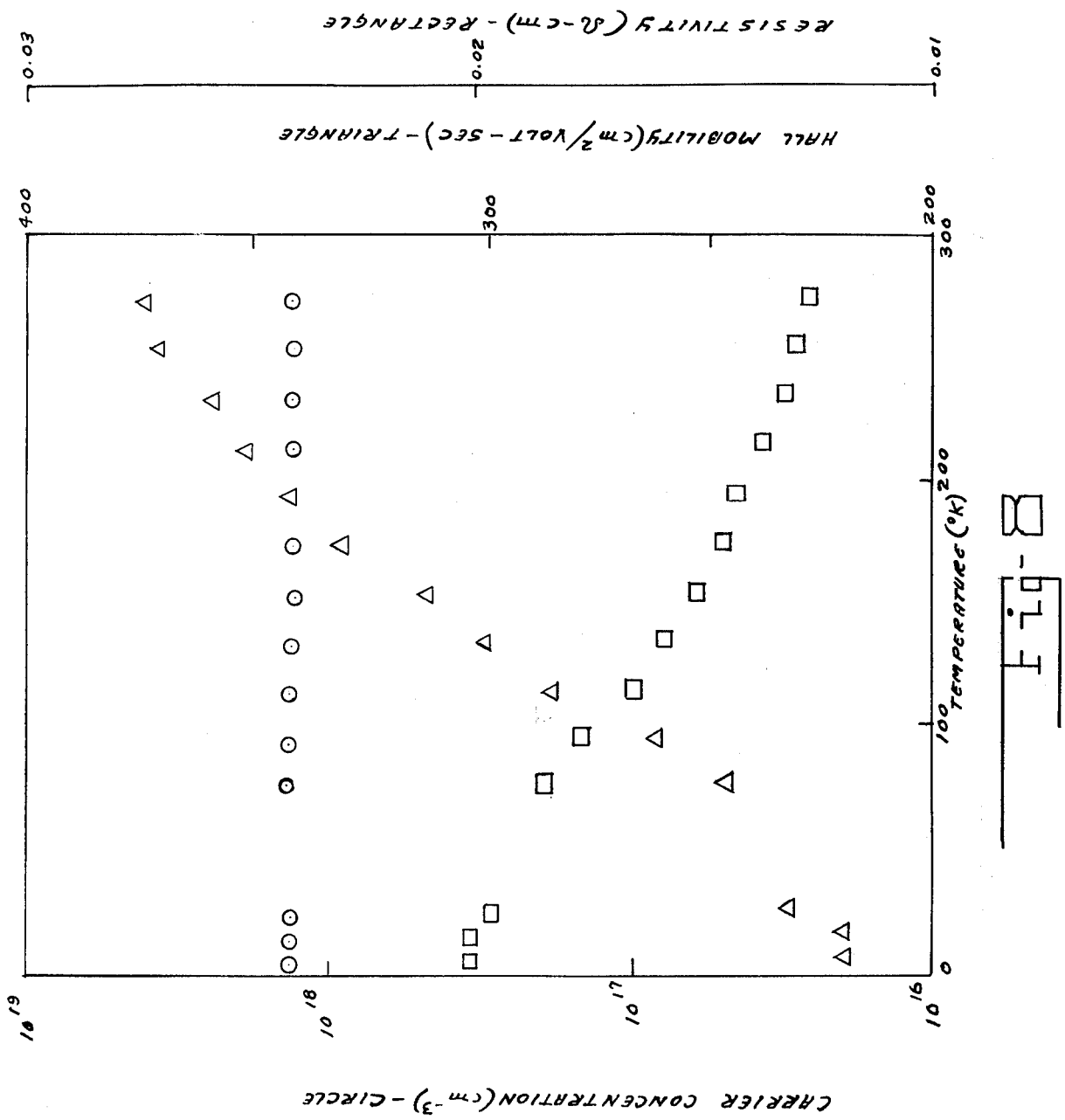
FIG. 8 is a typical set of measured characteristic data showing the temperature dependence of Hall mobility, resistivity, and carrier concentration in ZnSe single crystal substrate material (before P-ion implantation) of degenerate cubic n-type, doped with aluminum to a concentration of 100 ppm, at a magnetic field intensity of $H = 18KG$.

The characteristics of typical single crystal degenerate cubic n-type ZnSe substrate material suitable for these devices is shown in FIG. 8. These characteristics are before P-ion implantation. FIG. 8 illustrates the near-degenerate conduction attained in ZnSe doped with aluminum to a concentration of 100 ppm.

Figure 9:
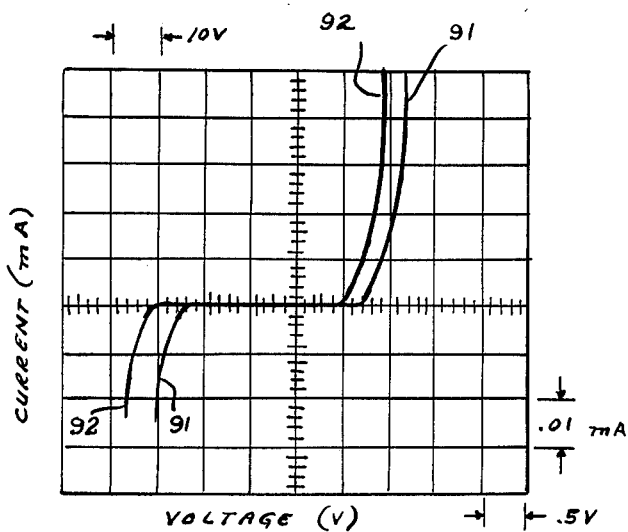
FIG. 9 is a typical plot showing the comparison of the current-voltage characteristics of a phosphorus implanted ZnSe diode measured in the dark at temperatures of 300°K and 200°K.

The general effect of temperature changes in these devices is shown in FIG. 9. Curve 91 is a plot of the characteristics of a typical P-ion implanted ZnSe diode constructed as taught herein made at 200°K. Curve 92 is a plot of the same diode with the temperature raised to 300°K.

The photovoltaic effect of these P-ion implanted ZnSe diodes have been observed. The open circuit spectral-response curve peaks at ≃ 4600A; the band edge of ZnSe. With intense white light incident on an implanted layer, a typical diode yielded an open-circuit voltage of 1.3V which can be considered a lower limit of the builtin potential formed in the diodes. This places the Fermi level in the implanted layer below the intrinsic Fermi level ( ≃ 1.33eV below the conduction band edge) of ZnSE. The polarity of the photovoltage showed the implanted layer to be positive with respect to the bulk.

EXAMPLE OF SPECIFIC EMBODIMENTS

LED'S

Electroluminescent diodes, commonly referred to as light emitting diodes (LED'S) are well known. ZnSe with its wide band gap characteristic of 2.67 eV at room temperature has been potentially very attractive as a prospectively very efficient electroluminescent material. Prior to this invention many attempts have been made to so utilize the material. However, with this material it is difficult to achieve amphoteric doping to produce p-n junctions, which are essential for efficient light-emitting diodes; although high-conductivity n-type ZnSe can be produced easily by conventional techniques, corresponding p-type ZnSe is difficult to achieve owing to self-induced compensating effects. In order to circumvent this problem, many alternative approaches such as metal-insulator-semiconductor (MIS) structures, heterojunction structures, p-n junctions from solid solutions, and less complex metal-semiconductor structures have been attempted previously with some degree of success. The formation, however, of a p-type layer in ZnSe to provide an efficient LED, prior to this invention, has met with only very limited success.

Utilizing the previous teachings contained herein for fabrication P-ion implanted ZnSe diodes and using ZnSe having aluminum doped carrier concentrations of approximately $10^{17}$ (i.e., 10 ppm), an implantation energy level of approximately 400 keV to provide phosphorus sheet dose concentration of approximately $10^{14}$ ions per square centimeter and post-annealing the device for five minutes in argon gas at atmospheric pressure at a temperature from approximately 450° to 500°C provides a very efficient LED as shown schematically in FIG. 10. (An anneal in a vacuum of approximately $10^{-6}$ torr may be used instead of the argon atmosphere, however the argon atmosphere is generally preferred.) The foregoing parameters are considered the generally preferred values however it is to be understood that within reasonable values they are not critical. For instance, satisfactorily operable LED devices may be produced with substrate dopant concentration from 7 or 8 ppm up to approximately 100 ppm and implantation energies may be utilized over the range of 100 to 500 keV.

Figure 11B:
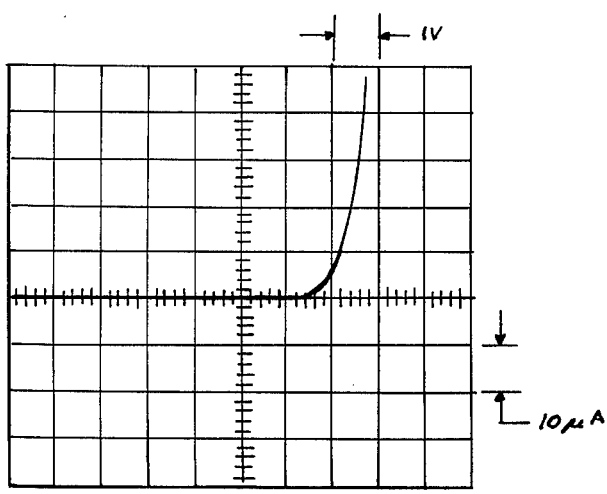
Figure 11A:
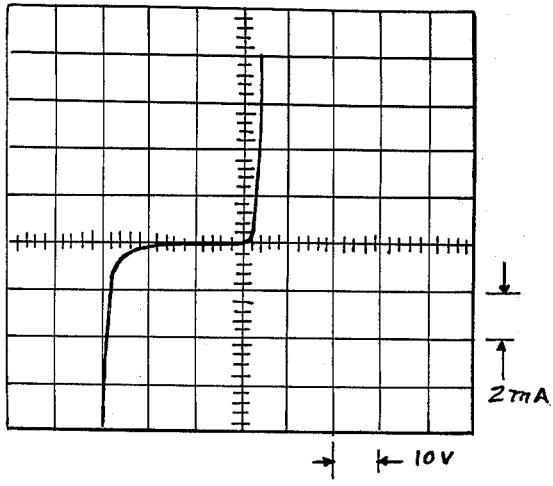
FIG. 11a is a plot of the typical current-voltage characteristics of an electroluminescent device.

FIGS. 11a and 11b show the I–V characteristics of a typical embodiment made at room temperature as was measured on a conventional diode curve tracer. The forward I–V characteristic is shown by the curve of FIG. 11b. The breakdown voltage of approximately 30 volts under reverse bias is shown by the curve of FIG. 11a. From these data it is apparent that the I–V characteristics of the device obey an ideal p-n junction relation $I \propto exp(eV/nkT)$, with the value of the coefficient $n=1.7$ at the low forward-current level.

Figure 12:
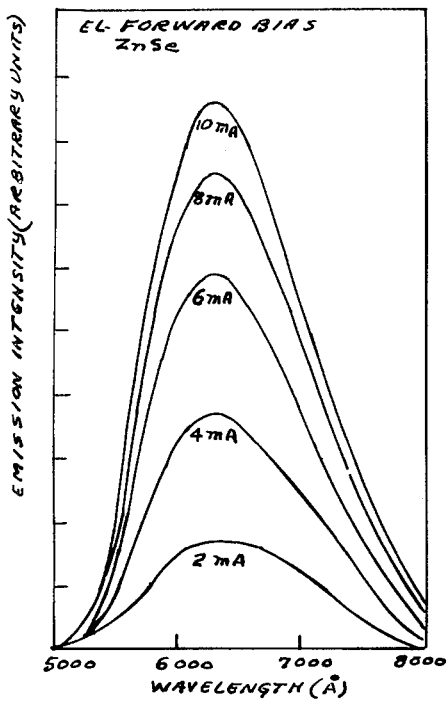
FIG. 12 shows the electroluminescence spectra of a typical forward-biased P-implanted ZnSe diode.
Figure 13:
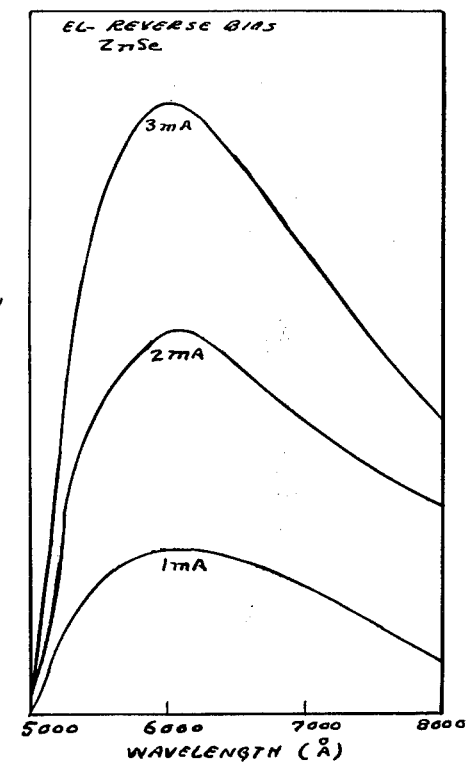
FIG. 13 shows the electroluminescence spectra of a typical reversed-biased P-implanted ZnSe diode.

In the forward bias the diode exhibits an electroluminescence spectrum very similar to the red photoluminescence spectrum with a peak at 6300A (1.97 eV) in room temperature, as is shown in FIG. 12. This is a characteristic luminescence for a P center in the ZnSe. When the diode is biased in the reverse direction, it emits light peaking at 5900A (2.10 eV), as is shown in FIG. 13. The electroluminescence band observed under reverse bias corresponds to the characteristic yellow band observed in the photoluminescence of Al-doped ZnSe from 3650A uv excitation. Analysis of data on the temperature dependence of photoluminescence spectra shows the band to be self-activated luminescence arising from transitions between localized states of a center consisting of a Zn vacancy and the impurity.

Figure 14:
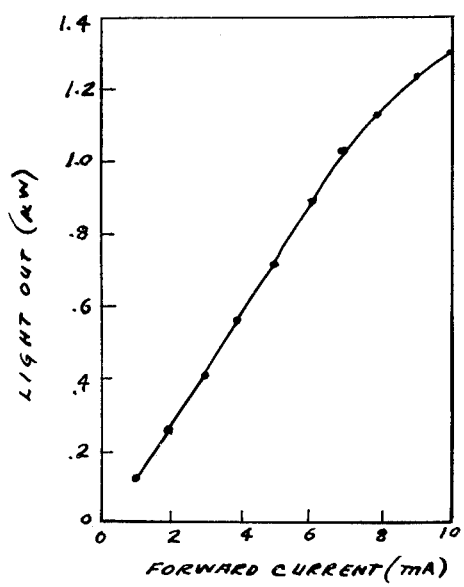
FIG. 14 is a plot of the light output vs input current for a typical forward-biased P-implanted ZnSe diode.

The emitted power of the 6300A line in the forward direction increases linearly with increasing current at low current levels (<6 mA), as is shown in FIG. 14. The sublinear power dependence of the current at higher current levels shows that heat is being generated locally. The power dependence of the electroluminescence in the reverse-bias breakdown region is similar to that in the case of forward bias. In the forward bias a light output power of 1 μW is obtained at about 6.5-mA input current and 5 V with 0.01 percent external quantum efficiency.

The fact that a fairly low-resistivity (10- to 570-ωcm) p-type layer is present in the implanted layer indicates that a shallow acceptor level has formed as a result of P ion implantation in the n-type ZnSe. It is generally known that the P dopants which substitute for Se in ZnSe act as deep acceptors having an activation energy of ≃ 0.7 eV. Therefore, the shallow acceptor level formed in the ion-implanted substrates may be due to P complexes. The existence and identification of the shallow level in the implanted ZnSe may be confirmed by further measurements.

SWITCHING AND MEMORY DIODES

Very efficient switching and memory diodes may be constructed by using substrates having carrier concentrations of approximately $10^{18}/cm^3$ (i.e., aluminum doping of approximately 100 ppm), using phosphorus ion implantation energies of approximately 90 keV to a dose level of P concentrations of approximately $10^{16}/cm^2$, and annealing for 5 minutes in air. The annealing in air creates a thin insulating film on the p-layer. The foregoing parameters are those that provide the optimum characteristics for switching and memory diodes. They are not critical. Satisfactorily operable devices may be produced with carrier concentrations from the range of approximately 80 to 800 ppm, implant energies in the range of approximately 70 to 100 keV, and anneal temperatures from 450° to 550°C in air.

Figure 15:
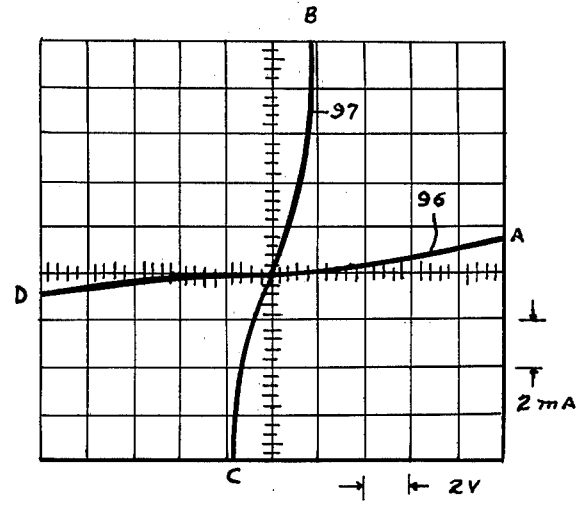
FIG. 15 is a plot of the characteristics of a typical phosphorus implanted ZnSe diode switching device showing the two switching states.

The embodiments fabricated in this manner exhibit switching and memory characteristics as illustrated by the typical current voltage characteristics of these devices obtained from a diode curve tracer as shown in FIG. 15. With forward bias (Au contact positive), the applied voltage increased from zero until a threshold voltage ($V_{th}$) of about 10 V was exceeded. At this voltage a transformation (switching) takes place from high-resistance state A curve 96 to low-resistance state B curve 97. The diodes were left under zero bias for more than a week; when the diodes were examined again, they were found to have remained in the B state. The B-state I-V characteristics were reproducible until a reverse bias was applied to the device, indicating the memory capability of the device. With reverse bias, the switching takes place from the low-resistance state C curve 97 to the high-resistance state D curve 96 at the threshold voltage of about 2 to 3 V. The devices remain in the D state indefinitely at zero bias.

A detailed study of the I-V characteristics of each state (A, B, C, and D) revealed a power-law relationship having the form $I \propto V^n$. In the A state the exponent N has the values 1 and 2 in the low current regions, and the current increases very rapidly at about 10 V. Switching from the A state to the B state takes place at the onset of the voltage region where the current increases steeply. The I-V characteristic of the B state remains ohmic for more than 4 decades of applied voltage up to about 2 V. When the reverse voltage was applied to the device, the C state still exhibited ohmic behavior at low-current values. At a current density of 10 A/cm², the C state switches to the D state with steep current increase. Between the states A to B and C to D, several intermediate metastable states are observed as the applied voltage is increased slowly. An abrupt voltage increase to about 10 V results in an instantaneous switching from the A to B state in a forward direction. The forward switching time from the A state to the B state is estimated to be in the order of 1 μsec or less.

BACKWARD DIODES

Backward diodes, without negative resistance, may be produced by the process taught herein by using ZnSe substrate material doped to a carrier concentration of approximately $10^{19}/cm^3$ (1000 ppm), using a P-ion implant energy of 90 KeV to provide a dose concentration of approximately $10^{16}$ ions/cm², and annealing the devices for approximately 10 minutes at a temperature of 600°C in argon gas at atmospheric pressure. These parameters are preferred but not critical. Carrier concentration may be used over the range of approximately 500 to 1200 ppm, the implantation energy may be within the range of approximately 70 to 100 KeV, and 550° to 650°C annealing temperatures may be used.

The forward I-V characteristics of tunnel diodes exhibit a pronounced current maximum which is attributed to the tunneling of electrons from filled states on the n-side to the unoccupied states on the p-side. (Tunneling in degenerate germanium p-n junction diodes is well known.) Tunneling becomes significant in a degenerate p-n junction with depletion widths of $\approx 100A$ and internal field strengths of $\approx 10^6$ V/cm. If the impurity content on one side of an abrupt junction is not quite degenerate, the negative-resistance region, (which is characteristic of a conventional tunnel diode), is absent and a backward diode results. Ion-implantation as taught herein provides a method of producing an abrupt p-n junction which is essential in electron tunneling.

Figure 16:
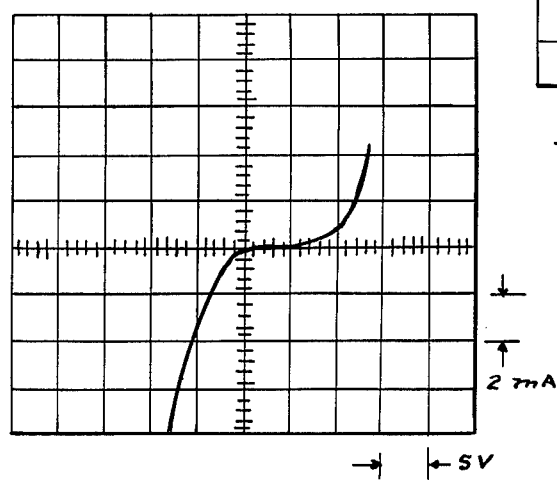
FIG. 16 is a plot of typical current-voltage characteristics of a phosphorus implanted ZnSe backward diode at room temperature.

At room temperature the typical I-V characteristics of the devices of this embodiment of the invention are shown by the plot of FIG. 16. It is that of a typical backward diode, i.e., it is more conductive in reverse bias than in forward bias. The shape of the I-V characteristic of these backward diodes is determined by the impurity concentration and other previously enumerated details of the construction of the junction. This particular shape of the characteristic as is provided by the previously stated preferred fabrication process is generally considered to be the optimum for these devices. The I-V characteristics are relatively temperature independent between 77° and 300°K. This relatively temperature-independent I-V characteristic, the low resistivity p-type layer, along with the backward diode characteristic provide fairly conclusive evidence that tunneling is taking place in the devices.

We claim:
1. A method of fabricating a P-N junction device in an aluminum doped n-type ZnSe single crystal having a first (110) plane surface and a second (110) plane surface comprising the steps of:
   a. heat treating the said crystal in molten zinc for approximately 24 hours at approximately 900°C;
   b. implanting a p-type layer on the said first surface by directing a phosphorus ion beam having an energy within the range from 70 to 500 keV on the said first surface providing a dosage from $10^{16}$ to $10^{14}$ per square centimeter;
   c. annealing the said crystal at a temperature within the range from approximately 400° centigrade to approximately 650° centigrade for approximately five to ten minutes;
   d. depositing a gold electrical contact on the said implanted p-type layer; and
   e. ultrasonic soldering an indium electrical contact to the said second surface.

2. A method of fabricating a P-N junction semiconductor device in an aluminum doped n-type ZnSe single crystal having a first (110) plane surface and a second (110) plane surface comprising the steps of:
   a. heat treating the said crystal in molten zinc for approximately 24 hours at a temperature of approximately 900°C;
   b. mechanically polishing the said first surface;
   c. etching both the said first and second surfaces in two parts $H_2SO_4$ and three parts $K_2Cr_2O_7$ for approximately one minute at a temperature within the range of 70°C to 90°C;
   d. rinsing the said crystal in approximately 25 percent by weight solution of boiling NaOH for approximately twenty seconds;
   e. rinsing the said crystal in boiling trichloroethylene;
   f. rinsing the said crystal in acetone;
   g. rinsing the said crystal in boiling methanol;
   h. rinsing the said crystal in deionized water;
   i. implanting a p-type layer on the said first surface at room temperature by directing a phosphorus ion beam having an energy level within the range of 70 keV to 500 keV with dosages within the range from $10^{16}$ to $10^{14}$ per square centimeter;
   j. annealing the said crystal at a temperature within the range of 400° centigrade to 650° centigrade for a time within the range of five to ten minutes;

k. depositing a gold electrical contract on the said implanted p-type layer on the first surface by sputtering or evaporation; and l. ultrasonic soldering an indium electrical contact to the said second surface.

3. A method of fabricating an electroluminescent semiconductor P-N junction diode in a ZnSe single crystal doped with aluminum providing an n-type crystal having an aluminum concentration of approximately 10 parts per million, the said aluminum doped crystal having a first (110) plane surface and a second (110) plane surface, the said method comprising the steps of:

a. heat treating the said crystal in molten zinc for approximately 24 hours at a temperature of approximately 900°C providing a carrier concentration per cubic centimeter of approximately $10^{17}$, and an ohm-cm resistivity of approximately 0.10;

b. implanting at room temperature a p-type layer on the said first surface by directing a phosphorus ion beam having an energy of approximately 400 keV on the said first surface providing a dosage of approximately $10^{14}$ per square centimeter;

c. annealing the said crystal at a temperature of approximately 450°C to 500°C in argon gas at atmospheric pressure for approximately 5 minutes;

d. depositing a gold electrical contact on the said implanted p-type layer; and e. ultrasonic soldering an indium electrical contact to the said second surface.

4. A method of fabricating a switching with memory P-N junction diode in a ZnSe single crystal doped with aluminum providing an n-type crystal having an aluminum concentration of approximately 10 parts per million, the said aluminum doped crystal having a first (110) plane surface and a second (110) plane surface, the said method comprising the steps of:

a. heat treating the said crystal in molten zinc for approximately 24 hours at a temperature of approximately 900°C providing a carrier concentration per cubic centimeter of approximately $10^{18}$, and an ohm-cm resistivity of approximately 0.01;

b. implanting at room temperature a p-type layer on the said first surface by directing a phosphorus ion beam having an energy of approximately 90 keV on the said first surface providing a dosage of approximately $10^{16}$ per square centimeter;

c. annealing the said crystal at a temperature of approximately 500°C for 5 minutes in air;

d. depositing a gold electrical contact on the said implanted p-type layer; and e. ultrasonic soldering an indium electrical contact to the said second surface.

5. A method of fabricating a P-N junction backward diode in a ZnSe single crystal doped with aluminum providing an n-type crystal having an aluminum concentration of approximately 1000 parts per million, the said aluminum doped crystal having a first (110) plane surface and a second (110) plane surface, the said method comprising the steps of:

a. heat treating the said crystal in molten zinc for approximately 24 hours at a temperature of approximately 900°C providing a carrier concentration per cubic centimeter of approximately $10^{19}$, and an ohm-cm resistivity of approximately 0.001;

b. implanting at room temperature a p-type layer on the said first surface by directing a phosphorus ion beam having an energy of approximately 90 keV on the said first surface providing a dosage of approximately $10^{16}$ per square centimeter;

c. annealing the said crystal at a temperature of approximately 600°C in argon gas at atmospheric pressure for approximately 10 minutes;

d. depositing a gold electrical contact on the said implanted p-type layer; and e. ultrasonic soldering an indium electrical contact to the said second surface.

* * * * *